(12) United States Patent
Shi et al.

(10) Patent No.: US 9,324,583 B2
(45) Date of Patent: Apr. 26, 2016

(54) PACKAGING METHOD

(75) Inventors: Lei Shi, Nantong (CN); Yujuan Tao, Nantong (CN); Guohua Gao, Nantong (CN); Jaingen Shi, Nantong (CN); Haiqing Zhu, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 2 days.

(21) Appl. No.: 13/981,116

(22) PCT Filed: Jan. 20, 2012

(86) PCT No.: PCT/CN2012/070628
§ 371 (c)(1),
(2), (4) Date: Jul. 23, 2013

(87) PCT Pub. No.: WO2012/100720
PCT Pub. Date: Aug. 2, 2012

(65) Prior Publication Data
US 2013/0302947 A1    Nov. 14, 2013

(30) Foreign Application Priority Data

Jan. 30, 2011 (CN) .......................... 2011 1 0032270
Jan. 30, 2011 (CN) .......................... 2011 1 0032591
Jan. 30, 2011 (CN) .......................... 2011 1 0032676

(51) Int. Cl.
*H01L 21/52* (2006.01)
*H01L 23/00* (2006.01)
(Continued)

(52) U.S. Cl.
CPC .............. *H01L 21/52* (2013.01); *H01L 21/561* (2013.01); *H01L 21/568* (2013.01);
(Continued)

(58) Field of Classification Search
USPC .......................................... 438/106, 118, 127
See application file for complete search history.

(56) References Cited

U.S. PATENT DOCUMENTS 7,230,334 B2    6/2007    Andry et al.
8,048,719 B2    11/2011   Nishimura et al.
(Continued)

FOREIGN PATENT DOCUMENTS

CN    1387240 A    12/2002
CN    1707792 A    12/2005
(Continued)

OTHER PUBLICATIONS

International Search Report for PCT Application No. PCT/CN2012/070628 mailed Apr. 26, 2012.
(Continued)

*Primary Examiner* — Mary Wilczewski
*Assistant Examiner* — Erik T Peterson
(74) *Attorney, Agent, or Firm* — RatnerPrestia

(57) ABSTRACT

The present invention relates to a packaging method including the steps: a cementing layer is formed on a carrier board; the functional sides of chips and passive devices are attached to the cementing layer; a sealing material layer is formed on the side of the carrier board to which the chips and the passive devices are attached, and packaging and curing are performed; and the carrier board and the cementing layer are removed. Compared to the prior art, the system-level fan-out wafer packaging method claimed by the present invention first integrates chips and passive devices and then packages the chips and the passive devices together, thereby forming a final packaged product having not single-chip functionality but integrated-system functionality. Compared to current system-level packaging, highly integrated wafer-level packaging reduces such interfering factors as system-internal electric resistance and inductance, and accommodates the growing demand for lighter, thinner, shorter, and smaller semiconductor packaging.

19 Claims, 15 Drawing Sheets

(51) Int. Cl.
*H01L 23/498* (2006.01)
*H01L 23/538* (2006.01)
*H01L 21/56* (2006.01)
*H01L 23/31* (2006.01)

(52) U.S. Cl.
CPC ..... *H01L 23/3128* (2013.01); *H01L 23/49816* (2013.01); *H01L 23/5389* (2013.01); *H01L 24/19* (2013.01); *H01L 24/20* (2013.01); *H01L 24/96* (2013.01); H01L 2224/04105 (2013.01); H01L 2224/12105 (2013.01); H01L 2224/24195 (2013.01); H01L 2924/12042 (2013.01); H01L 2924/181 (2013.01); H01L 2924/1815 (2013.01); H01L 2924/19105 (2013.01)

(56) References Cited

U.S. PATENT DOCUMENTS

| | | | |
|---|---|---|---|
| 2002/0187588 | A1 | 12/2002 | Omizo et al. |
| 2004/0178496 | A1 | 9/2004 | Rapport et al. |
| 2005/0269128 | A1 | 12/2005 | Usui et al. |
| 2008/0122086 | A1 | 5/2008 | Tsao et al. |
| 2008/0136026 | A1* | 6/2008 | Yang ............................... 257/738 |
| 2008/0316714 | A1* | 12/2008 | Eichelberger et al. ........ 361/728 |
| 2009/0026566 | A1* | 1/2009 | Oliver et al. .................. 257/433 |
| 2009/0152715 | A1* | 6/2009 | Shim et al. ..................... 257/737 |
| 2009/0302486 | A1* | 12/2009 | Terashima et al. ............. 257/797 |
| 2012/0038034 | A1* | 2/2012 | Shin et al. ..................... 257/676 |

FOREIGN PATENT DOCUMENTS

| | | |
|---|---|---|
| CN | 1949468 A | 4/2007 |
| CN | 101009269 A | 8/2007 |
| CN | 201174601 A | 5/2008 |
| CN | 101425469 A | 5/2009 |
| CN | 101604638 A | 12/2009 |
| CN | 102157400 A | 8/2011 |
| CN | 102157401 A | 8/2011 |
| CN | 102169840 A | 8/2011 |
| JP | 64-18247 | 1/1989 |
| JP | 1-220463 | 9/1989 |
| JP | 6-42343 | 11/1994 |
| JP | 2005-347514 | 12/2005 |

OTHER PUBLICATIONS

Notification on Patent Registration Formalities and Notification on Grant of Patent Right for Invention for Chinese Application No. 201110032676.5 dated Mar. 14, 2013.

* cited by examiner

PACKAGING METHOD

CROSS-REFERENCE TO RELATED APPLICATIONS

The present application is a Section 371 National Stage Application of International Application No. PCT/CN2012/070628, filed on Jan. 20, 2012, which claims priority to Chinese patent application No. 201110032270.7, filed on Jan. 30, 2011, and entitled "SYSTEM-LEVEL FAN-OUT WAFER PACKAGING METHOD", Chinese patent application No. 201110032676.5, filed on Jan. 30, 2011, and entitled "HIGH-DENSITY SYSTEM-LEVEL CHIP PACKAGING METHOD", and Chinese patent application No. 201110032591.7, filed on Jan. 30, 2011, and entitled "HIGH-INTEGRITY WAFER FAN-OUT PACKAGING METHOD", and the entire disclosures of which are incorporated herein by reference.

FIELD OF THE DISCLOSURE

The present disclosure generally relates to semiconductor technology, and more particularly, to a packaging method.

BACKGROUND OF THE DISCLOSURE

Wafer Level Packaging (WLP) is a technology in which a whole wafer is packaged and tested, and then diced into individual chips. The size of a packaged chip is almost the same as that of a bare chip. Wafer Level Chip Size Packaging (WLCSP) technology is totally different from conventional packaging technologies such as Ceramic Leadless Chip Carrier and Organic Leadless Chip Carrier, and satisfies the market requirements for micro-electronic products, e.g., light in weight, small in size, thin in thickness and low in cost. Packaging with the WLCSP technology realizes high miniaturization, and the chip cost decreases significantly with the decrease of the chip size and the increase of the wafer size. The WLCSP technology, which, when being implemented, may take into account the IC design, wafer fabrication and packaging test in combination, is currently a focus in the packaging field and becomes one of the development trends of the packaging technologies.

Fan-out wafer packaging is one kind of WLP. For example, a wafer level fan-out chip packaging method, disclosed in a Chinese invention patent application No. 200910031885.0, includes following process steps: a stripping foil and a film dielectric layer I are sequentially formed on a surface of a wafer of a carrier, and a photoetching pattern opening I is formed on the film dielectric layer I; a metal electrode and a re-wiring metal routing wire which are connected with a base plate end are arranged on the photoetching pattern opening I and a surface thereof, and a film dielectric layer II is formed on a surface of the metal electrode, a surface of the re-wiring metal routing wire, and a surface of the film dielectric layer I which are connected with the base plate end, and a photoetching pattern opening II is formed on the film dielectric layer II; a metal electrode connected with a chip end is arranged on the photoetching pattern opening II; after a chip is arranged on the metal electrode connected with the chip end in an inverting way, the injection molding of packaging material and curing are performed, so as to form a packaging body with plastic-packaging material; the wafer of the carrier and the stripping foil are separated from the packaging body with plastic-packaging material, so as to form a plastic-packaging wafer; a solder ball is reflowed to form a bump; and singulation is performed to form the final structure of the fan-out chip.

Final products packaged and manufactured by the above method only have single-chip functions. To realize whole-system functions, besides a final product, a periphery circuit including all kinds of capacitors, inductors and resistors is required.

SUMMARY

Embodiments of the present disclosure may provide a high-integrity packaging method.

In an embodiment, a packaging method may include: forming an adhesive layer on a carrier board; affixing a chip and a passive device on the adhesive layer with functional surfaces of the chip and passive device attached to the adhesive layer; forming a sealing material layer on a surface of the carrier board to which the chip and the passive device are attached and performing packaging and curing; and removing the carrier board and the adhesive layer.

In an embodiment, a packaging method may include: forming an adhesive layer on a carrier board, where a shape and position of the adhesive layer may correspond to shapes of functional surfaces of devices to be packaged and positions on the carrier board where the devices to be packaged are to be attached, respectively; affixing a chip and a passive device on the adhesive layer with functional surfaces of the chip and passive device attached to the adhesive layer; forming a sealing material layer on a surface of the carrier board to which the chip and the passive device are attached and performing packaging and curing; and removing the carrier board and the adhesive layer.

In an embodiment, a packaging method may include: forming an adhesive layer on a carrier board; affixing units to be packaged formed by a chip and a passive device on the adhesive layer with functional surfaces of the units to be packaged attached to the adhesive layer; forming a sealing material layer on a surface of the carrier board to which the chip and the passive device are attached and performing packaging and curing, where a groove may be formed on the sealing material layer in a position corresponding to the interval between the units to be packaged; and removing the carrier board and the adhesive layer.

Compared with the conventional methods, the present disclosure has following advantages.

In the packaging method in one embodiment of the present disclosure, since the chip and the passive device are integrated and packaged together, the packaging structure is a packaging product including whole-system functions but not single-chip functions. Compared with conventional system-level packaging structures, the packaging structure in the present disclosure has high integrity, decreases interference factors in a system, such as resistors or inductors, and goes with the trend that semiconductor packaging is becoming light, thin and short.

In the packaging method in one embodiment of the present disclosure, the shape and position of the adhesive layer formed on the carrier board may correspond to the shapes of the functional surfaces of the devices to be packaged and the positions on the carrier board where the devices to be packaged are to be attached, respectively, which facilitates the localization of mounting chips and avoids difficulty in peeling or widespread cleaning in subsequent processes.

In the packaging method in one embodiment of the present disclosure, the whole packaging of the sealing material layer is divided into a plurality of small packaged blocks to reduce the inner stress of the sealing material layer, which avoids warp and distortion of the sealing material layer in subsequent processes during wafer packaging and improves the quality of wafer packaging products.

DETAILED DESCRIPTION OF THE DISCLOSURE

In the following description, for the purposes of explanation, numerous specific details are set forth in order to provide a thorough understanding of the present disclosure. It will be apparent, however, to those skilled in the art that the present disclosure may be practiced with other embodiments different from embodiments described below. Accordingly, the present disclosure is not restricted to the embodiments described.

Besides, embodiments of present disclosure will be described in detail in conjunction with accompanying drawings. The drawings as examples are not used to limit the present disclosure.

Hereinafter, embodiments of the present disclosure will be described in detail in conjunction with accompanying drawings.

Figure 1:
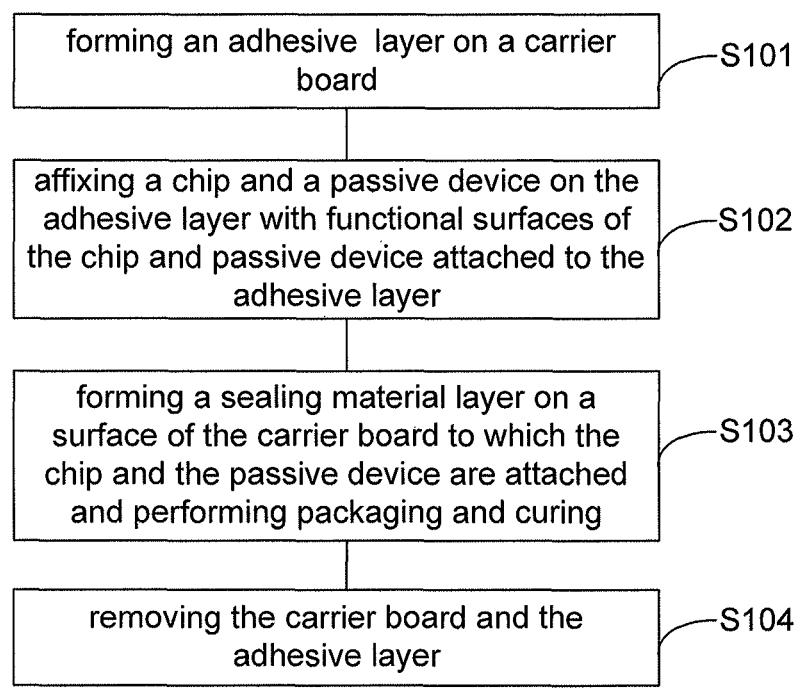
FIG. 1 schematically illustrates a flow chart of a packaging method according to a first embodiment of the present disclosure.

As shown in FIG. 1, in a first embodiment of the present disclosure, a packaging method may include following steps:

S101, forming an adhesive layer on a carrier board;

S102, affixing a chip and a passive device on the adhesive layer with functional surfaces of the chip and passive device attached to the adhesive layer;

S103, forming a sealing material layer on a surface of the carrier board to which the chip and the passive device are attached and performing packaging and curing; and S104, removing the carrier board and the adhesive layer.

Figure 2:
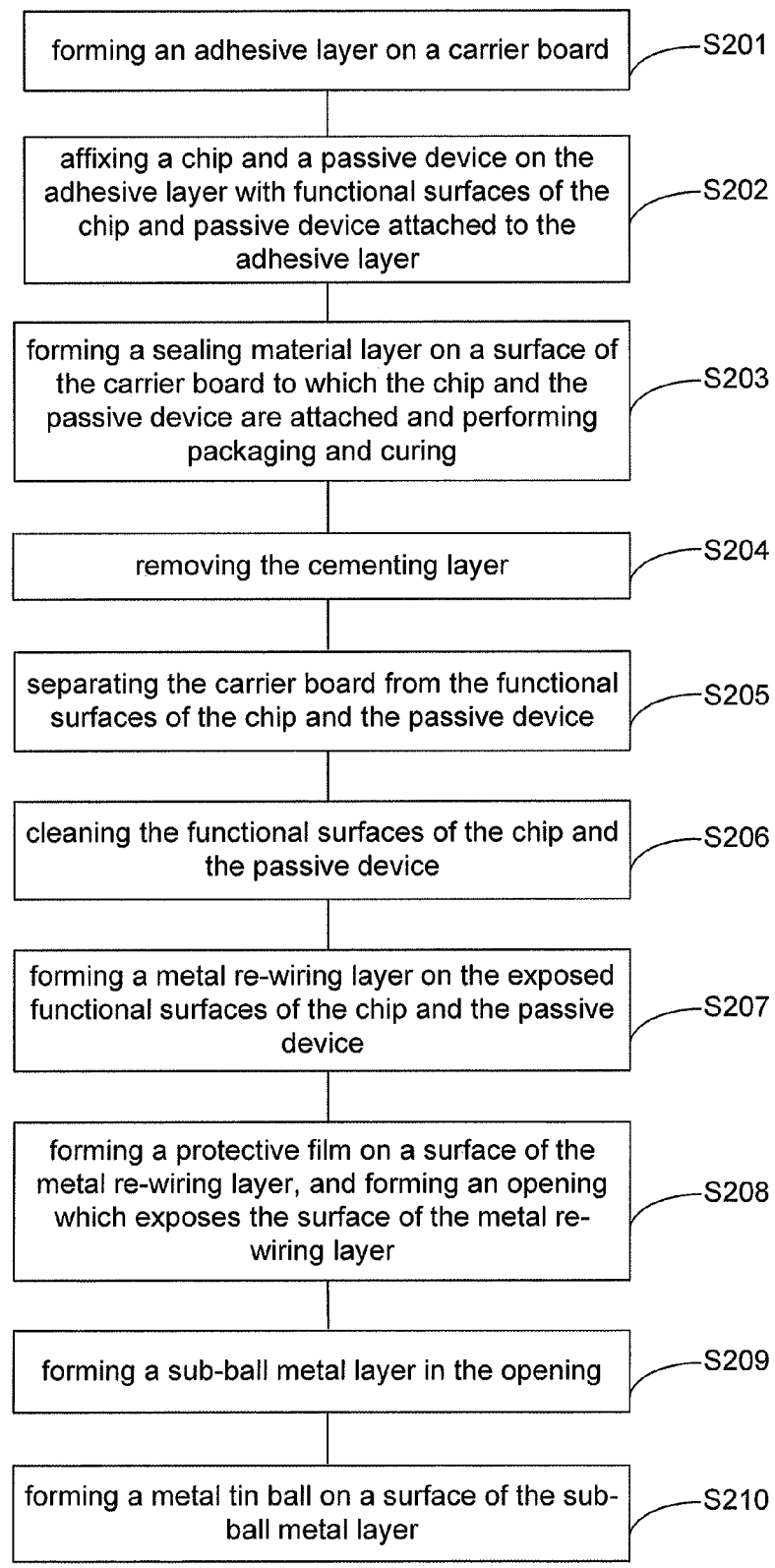
FIG. 2 schematically illustrates a flow chart of a packaging method according to a second embodiment of the present disclosure.

As shown in FIG. 2, in a second embodiment of the present disclosure, a packaging method may include following steps:

S201, forming an adhesive layer on a carrier board;

S202, affixing a chip and a passive device on the adhesive layer with functional surfaces of the chip and passive device attached to the adhesive layer;

S203, forming a sealing material layer on a surface of the carrier board to which the chip and the passive device are attached and performing packaging and curing;

S204, removing the adhesive layer;

S205, separating the carrier board from the functional surfaces of the chip and the passive device;

S206, cleaning the functional surfaces of the chip and the passive device;

S207, forming a metal re-wiring layer on the exposed functional surfaces of the chip and the passive device;

S208, forming a protective film on a surface of the metal re-wiring layer, and forming an opening which exposes the surface of the metal re-wiring layer;

S209, forming a sub-ball metal layer in the opening; and

S210, forming a metal tin ball on a surface of the sub-ball metal layer.

Figure 3:
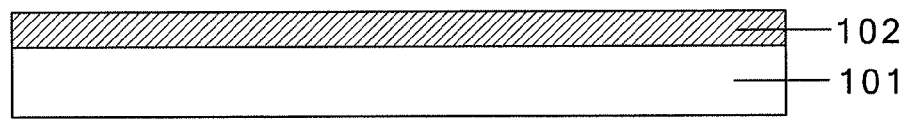
FIGS. 3 to 10 schematically illustrate intermediate cross-sectional views of a packaging structure formed with the method shown in FIG. 2.

In some embodiments, S201 may be performed first. An adhesive layer 102 may be formed on a carrier board 101, so as to form a structure shown in FIG. 3.

In S201, the carrier board 101 may be adapted to bear a chip 103 and a passive device 104.

In some embodiments, the carrier board 101 may be made of glass, which may have a good hardness and evenness, and reduce a failure rate of packaging. Besides, the carrier board 101 may be peeled in subsequent processes. Since the carrier board 101 made of glass may be easily peeled and has a good resistance to corrosion, the carrier board 101 may not change in physical and chemical performance after contacting with the adhesive layer 102 and may be used repeatedly. It is well known in the art that a carrier board 101 made of other materials, such as silicon compound, may realize the objectives of the present disclosure as well.

The adhesive layer 102 formed on the carrier board 101 is adapted to fix the chip 103 and the passive device 104 on the carrier board 101. The adhesive layer 102 may be made of different materials. In some embodiments, the adhesive layer 102 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 102 may be the second kind.

The method for forming the adhesive layer 102 on the carrier board 101 may be spin coating or printing, which are well known to those skilled in the art and not described in detail here.

Figure 4:
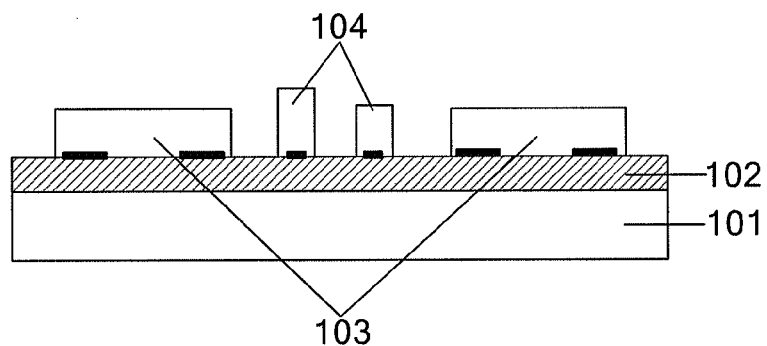

Thereafter, S202 may be performed. Functional surfaces of a chip 103 and a passive device 104 are affixed on the adhesive layer 102 to form a structure shown in FIG. 4.

In some embodiments, the functional surfaces of the chip 103 and the passive device 104 may refer to a surface where a metal electrode of the chip 103 and a pad of the passive device 104 are disposed.

In some embodiments, a plurality of chips 103 attached to the adhesive layer 102 may include a plurality of different chips. The plurality of different chips may be a portion of a system-level packaging product and realize one or more independent function of system-level functions respectively.

The passive device 104, realizing system-level functions of packaging products along with the chips 103, is an external circuit, such as capacitors, resistors and inductors. The passive device 104 and the chips 103 with different functions are combined to a whole and then packaged, which may realize the required system-level functions.

In some embodiments, the combination of the chip 103 and the passive device 104 may be designed according to system functions. Therefore, around a chip 103, there may be one or more chips 103 having same or different functions, or there may be one or more passive devices 104 having same or different functions, such as capacitors, resistors or inductors. Similarly, around a passive device 104, there may be one or more passive devices 104 having same or different functions, or there may be one or more chips 103 having same or different functions.

Figure 5:
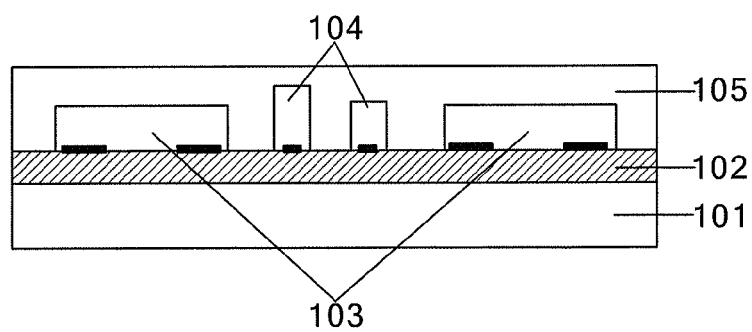

Thereafter, S203 may be performed. A surface of the carrier board attached to the chip and passive device is packaged and cured, so as to form a packaging body with a sealing material layer 105, i.e., to form a structure shown in FIG. 5. In subsequent process steps, the packaging body may protect all the surfaces except the functional surfaces of the chip 103 and the passive device 104 and act as a carrier in the subsequent processes.

In some embodiments, the sealing material layer 105 may be made of epoxy resin. Epoxy resin is a good material for forming the sealing material layer 105 as it has good sealability and is easily shaped. A method for forming the sealing material layer 105 may be transfer molding, compressing or printing, which are well known to those skilled in the art and not described in detail here.

As described above, around a chip 103, there may be other chips 103 or passive devices 104. And around a passive device 104, there may be one or more passive devices 104 having same or different functions, or there may be one or more chips 103 having same or different functions. Therefore, spaces may exist around the chips 103 and the passive devices 104. To protect the chips 103 and the passive devices 104 better, the sealing material layer 105 may be filled into spaces between the chips 103, between the chips 103 and the passive devices 104, and/or between the passive devices 104, The chip 103 may have a different thickness with the passive device 104, namely, the chip 103 may have a greater thickness, or the passive device 104 may have a greater one. Therefore, the sealing material layer 105 may have a thickness greater than anyone of the chip 103 and the passive device 104, which ensures better protection for the chip 103 and the passive device 104.

Thereafter, S204 may be performed. The adhesive layer 102 is removed. Since the adhesive layer 102 is organic and can be dissolved in certain organic solvent, the adhesive layer 102 may be removed by dissolving in an organic solvent.

Thereafter, S205 may be performed. The carrier board 101 is separated from the functional surfaces of the chip 103 and the passive device 104. Namely, after S204, the adhesive layer 102 is dissolved, or is molten and peelable. The carrier board 101 may be peeled from the functional surfaces of the chip 103 and the passive device 104 easily, exposing the functional surfaces of the chip 103 and the passive device 104.

Figure 6:
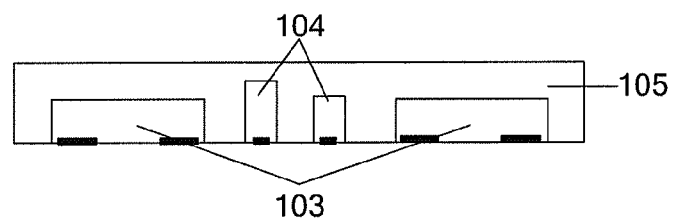
Figure 7:
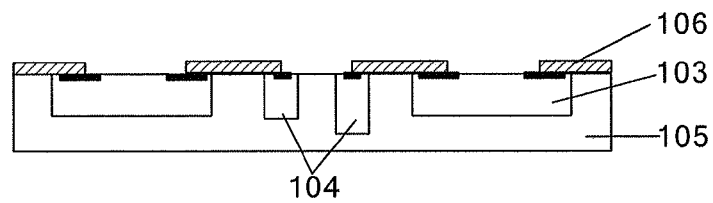
Figure 8:
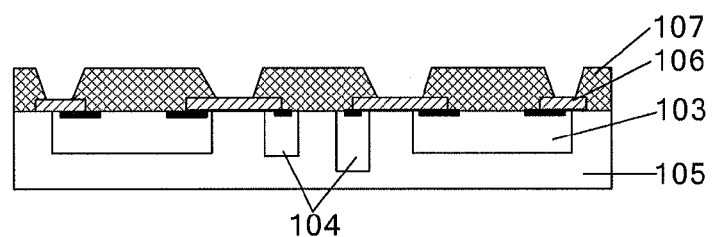
Figure 9:
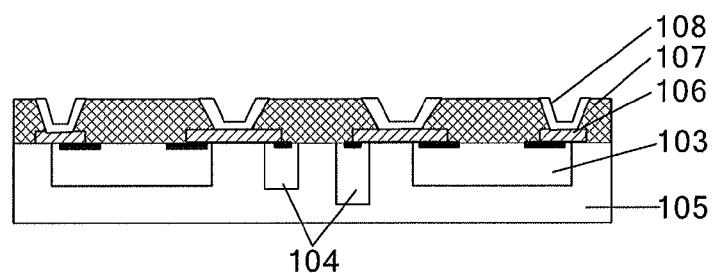
Figure 10:
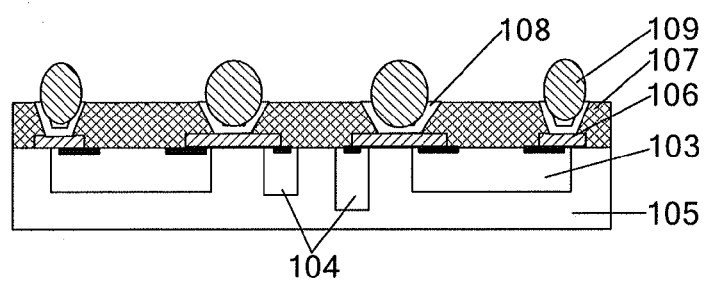

Thereafter, S206 may be performed. The functional surfaces of the chip 103 and the passive device 104 may be cleaned to remove the residual adhesive layer 102, so as to form a structure shown in FIG. 6. The chip 103 and the passive device 104 are no longer fixed together by the carrier board but by the packaging body, and the metal electrode of the chip 103 and the pad of the passive device 104 are exposed.

As shown in FIG. 7 to FIGS. 10, S207 to S210 are performed, including: forming a metal re-wiring layer 106 on the exposed functional surfaces of the chip 103 and the passive device 104, so that the metal electrode of the chip 103 may be functionally connected to the pad of the passive device 104 in system level; forming a protective film 107 on a surface of the metal re-wiring layer 106, and forming an opening by design requirements on the protective film 107 to expose the metal re-wiring layer 106; forming a sub-ball metal layer 108 in the opening; and forming a metal tin ball 109 on a surface of the sub-ball metal layer 108. S207 to S210 can be performed similarly to existing fan-out wafer packaging methods, which are not described in detail here.

After performing the above steps, system-level packaging may be basically completed.

Figure 11:
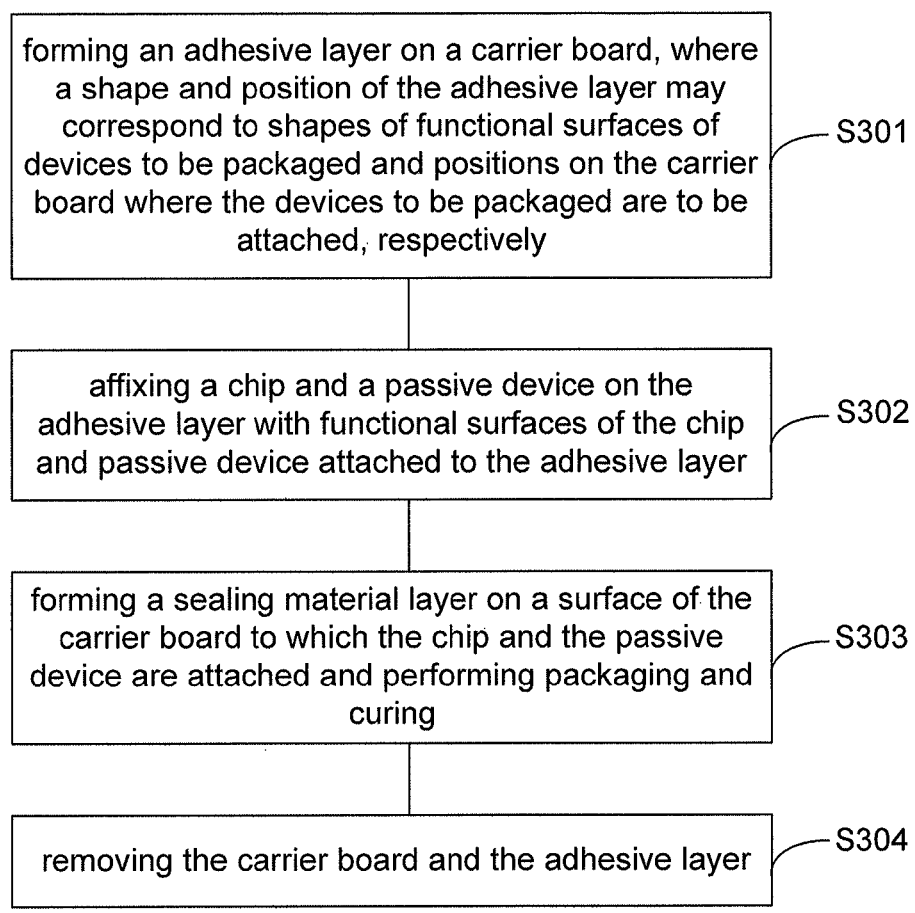
FIG. 11 schematically illustrates a flow chart of a packaging method according to a third embodiment of the present disclosure.

As shown in FIG. 11, in a third embodiment of the present disclosure, a packaging method may include following steps:

S301, forming an adhesive layer on a carrier board, where a shape and position of the adhesive layer may correspond to shapes of functional surfaces of devices to be packaged and positions on the carrier board where the devices to be packaged are to be attached, respectively;

S302, affixing a chip and a passive device on the adhesive layer with functional surfaces of the chip and passive device attached to the adhesive layer;

S303, forming a sealing material layer on a surface of the carrier board to which the chip and the passive device are attached and performing packaging and curing; and S304, removing the carrier board and the adhesive layer.

Figure 12:
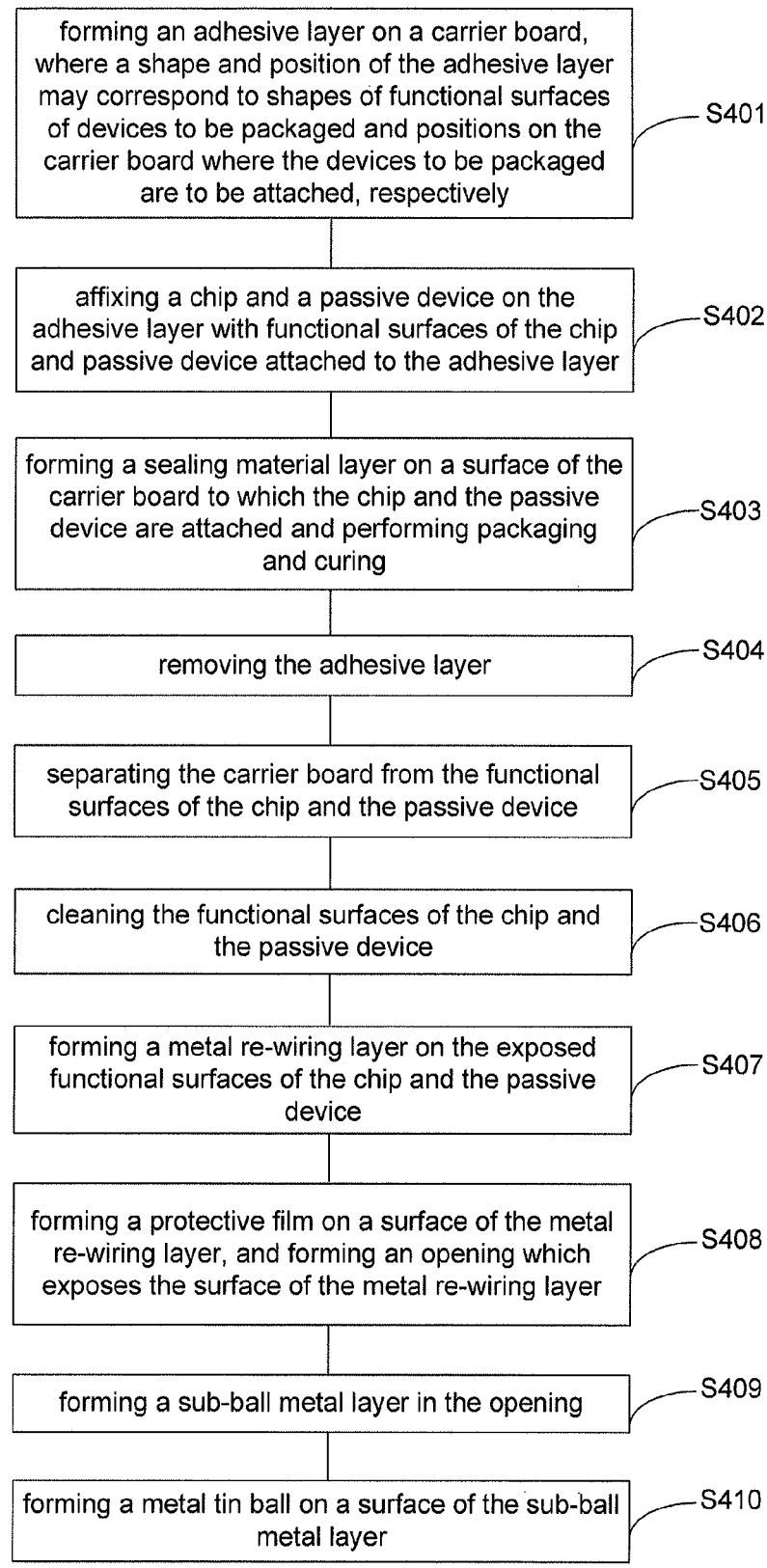
FIG. 12 schematically illustrates a flow chart of a packaging method according to a fourth embodiment of the present disclosure.

As shown in FIG. 12, in a fourth embodiment of the present disclosure, a packaging method may include following steps:

S401, forming an adhesive layer on a carrier board, where a shape and position of the adhesive layer may correspond to shapes of functional surfaces of devices to be packaged and positions on the carrier board where the devices to be packaged are to be attached, respectively;

S402, affixing a chip and a passive device on the adhesive layer with functional surfaces of the chip and passive device attached to the adhesive layer;

S403, forming a sealing material layer on a surface of the carrier board to which the chip and the passive device are attached and performing packaging and curing;

S404, removing the adhesive layer;

S405, separating the carrier board from the functional surfaces of the chip and the passive device;

S406, cleaning the functional surfaces of the chip and the passive device;

S407, forming a metal re-wiring layer on the exposed functional surfaces of the chip and the passive device;

S408, forming a protective film on a surface of the metal re-wiring layer, and forming an opening which exposes the surface of the metal re-wiring layer;

S409, forming a sub-ball metal layer in the opening; and

S410, forming a metal tin ball on a surface of the sub-ball metal layer.

Figure 13:
FIG. 13 and FIGS. 19 to 25 schematically illustrate intermediate cross-sectional views of a packaging structure formed with the method shown in FIG. 12.

In some embodiments, S401 may be performed first. An adhesive layer 202 may be formed on a carrier board 201, so as to form a structure shown in FIG. 13.

In S401, the carrier board 201 may be adapted to bear a chip 203 and a passive device 204.

In some embodiments, the carrier board 201 may be made of glass, which may have a good hardness and evenness, and reduce a failure rate of packaging. Besides, the carrier board 201 may be peeled in subsequent processes. Since the carrier board 201 made of glass is easily peeled and has a good resistance to corrosion, the carrier board 201 may not change in physical and chemical performance after contacting with the adhesive layer 202 and may be used repeatedly. It is well known in the art that a carrier board 201 made of other materials, such as silicon compound, may realize the objectives of the present disclosure as well.

The adhesive layer 202 formed on the carrier board 201 is adapted to fix the chip 203 and the passive device 204 on the carrier hoard 201. The adhesive layer 202 may be made of different materials. In some embodiments, the adhesive layer 202 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 202 may be the second kind.

The method for forming the adhesive layer 202 on the carrier board 201 may be spin coating or printing, which are well known to those skilled in the art and not described in detail here.

During wafer fan-out packaging, devices to be packaged, such as different chips and passive devices, may be affixed on the carrier board 201 by the adhesive layer 202. If without any other assistant measures, the devices to be packaged may not be arranged on the carrier board 201 accurately, which may cause defects or even failures of packaging products, thereby reducing packaging yield.

Figure 14:
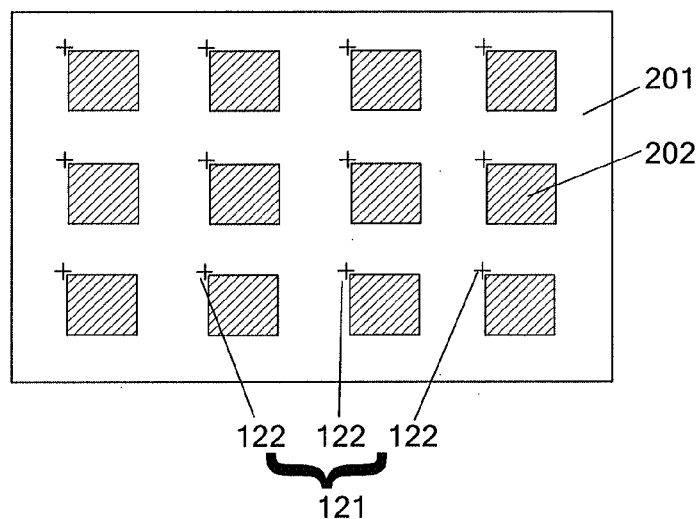
FIG. 14 schematically illustrates a top view of a carrier board 201 according to the fourth embodiment of the present disclosure.

Therefore, as shown in FIG. 14, in some embodiments, a shape and a position of the adhesive layer 202 may correspond to shapes of functional surfaces of the devices to be packaged and positions on the carrier board where the devices to be packaged are to be attached, respectively. In a subsequent adhesive process in wafer packaging, the devices to be packaged may be attached according to positions on the adhesive layer 202. Namely, the adhesive layer 202 may provide alignment for the devices to be packaged.

In some embodiments, the adhesive layer 202 on the carrier board 201 may be formed by a plurality of separated adhesive blocks. The separated adhesive blocks may be formed on the carrier board 201 by mask printing, stencil printing or pen-writing, which are well known to those skilled in the art and not described in detail here.

The plurality of adhesive blocks may be square, rectangular or circular, to meet the requirement that functional surfaces of different devices to be packaged have different shapes In some embodiments, shapes of the plurality of adhesive blocks may be irregular, for example, an irregular pattern designed according to practical requirements.

As described above, during wafer fan-out packaging, devices to be packaged, such as different chips and passive devices, may be affixed on the carrier board 201 by the adhesive layer 202. Functional surfaces of different chips and different passive devices may have different shapes and sizes. Therefore, adhesive blocks may be formed to have different shapes according to requirements. In some embodiments, at least two adhesive blocks have different shapes among the plurality of adhesive blocks formed on the carrier board 201. This design is determined according to characteristics of fan-out wafer packaging but the present disclosure will not be limited thereto. In some embodiments, the chips having different functions may have a same size, and the plurality of adhesive blocks may have a same shape.

The plurality of adhesive blocks may be arranged on the carrier block 201 in matrix. In some embodiments, during system-level fan-out wafer packaging, the plurality of adhesive blocks may be arranged according to distribution of devices to be packaged including chips and passive devices. The chips and the passive devices may form a system unit according to design requirements and system units may be arranged in matrix. In some embodiments, distance between the matrixes may be the same as that between the adhesive blocks of the devices to be packaged to meet the requirement of a subsequent sealing process.

Besides, an alignment part 221 may be formed on the carrier board 201, adapted to determine a direction of the devices to be packaged to make the devices to be packaged face a certain direction according to requirements, so as to avoid mistakes, such as an upside down direction. Therefore, during a subsequent adhesive process for devices to be packaged in wafer packaging, an attaching direction of the devices to be packaged may be determined according to the alignment part 221 directly.

In practice, shapes of the alignment part 221 may be determined according to shapes of functional surfaces of the devices to be packaged, such as a square, a rectangle or a circle. The alignment part 203 may be formed on the carrier board 201 by etching or laser-writing, which are well known to those skilled in the art and not described in detail here.

In above embodiments, the adhesive layer 202 includes a plurality of adhesive blocks separated from one another, but the present disclosure is not limited thereto. In some embodiments, the alignment part 221 may be formed as a whole and not separated. Accordingly, the adhesive layer 202 may be formed as a whole and not include a plurality of separated adhesive blocks.

Figure 15:
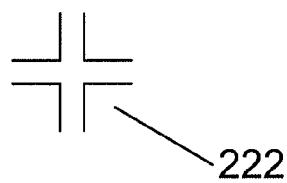
FIGS. 15 to 18 schematically illustrate an alignment part 221 formed by a plurality of location parts 222 according to the fourth embodiment of the present disclosure.
Figure 16:
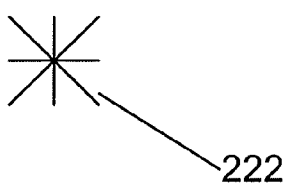
Figure 17:
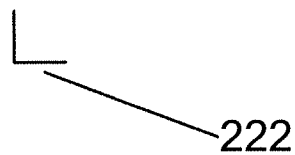
Figure 18:

A shape and size of the alignment part 221 may be determined by a plurality of location parts 222. In some embodiments, the plurality of location parts 222 may be cruciform, as shown in FIG. 15, or dual cruciform, or star-shaped, as shown in FIG. 16, or L-shaped, as shown in FIG. 17, or dual-L-shaped, as shown in FIG. 18. Similarly, in these embodiments, the plurality of location parts 222 may be formed on the carrier board 201 by etching or laser-writing.

Figure 19:
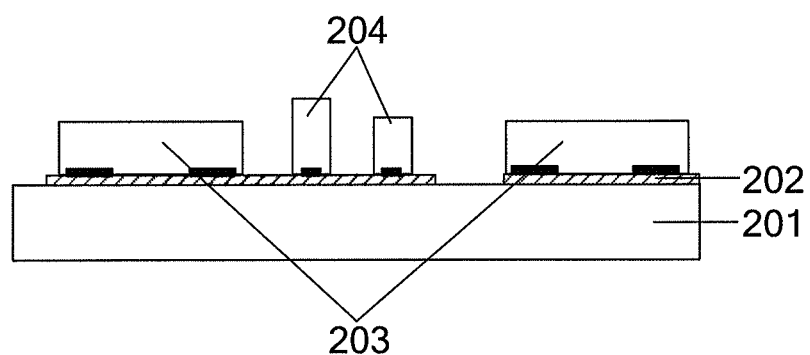

Thereafter, S402 may be performed. Functional surfaces of a chip 203 and a passive device 204 are affixed on the adhesive layer 202 to form a structure shown in FIG. 19.

In some embodiments, the functional surfaces of the chip 203 and the passive device 204 may refer to surfaces where a metal electrode of the chip 203 and a pad of the passive device 204 are disposed.

In some embodiments, the chip 203 attached to the adhesive layer 202 may include a plurality of different chips. The plurality of different chips may be a portion of a system-level packaging product and realize one or more independent functions of system-level functions respectively.

The passive device 204, realizing system-level functions of packaging products along with the chip 203, is an external circuit, such as capacitors, resistors or inductors. The passive device 204 and the chip 203 with different functions are combined as a whole and then packaged, which may realize the required system-level functions.

In some embodiments, the combination of the chip 203 and the passive device 204 may be designed according to system functions. Therefore, around a chip 203, there may be one or more chips 203 having same or different functions, or there may be one or more passive devices 204 having same or different functions, such as capacitors, resistors or inductors. Similarly, around a passive device 204, there may be one or more passive devices 204 having same or different functions, or there may be one or more chips 203 having same or different functions.

Figure 20:
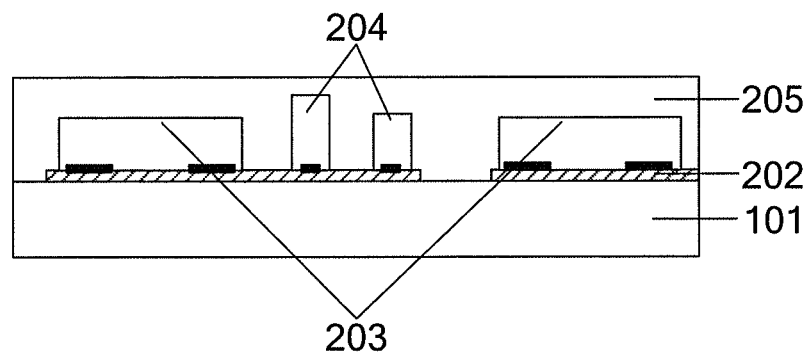

Thereafter, S403 may be performed. A surface of the carrier board attached to the chip and passive device is packaged and cured, so as to form a packaging body with a sealing material layer 205, i.e., to form a structure shown in FIG. 20. In subsequent process steps, the packaging body may protect all the surfaces except the functional surfaces of the chip 203 and the passive device 204 and act as a carrier in the subsequent processes.

In some embodiments, the sealing material layer 205 may be made of epoxy resin. Epoxy resin is a good material for forming the sealing material layer 205 as it has good sealability and is easily shaped. A method for forming the sealing material layer 205 may be transfer molding, compressing or printing, which are well known to those skilled in the art and not described in detail here.

As described above, around a chip 203, there may be other chips 203 or passive devices 204. And around a passive device 204, there may be one or more passive devices 204 having same or different functions, or there may be one or more chips 203 having same or different functions. Therefore, spaces may exist around the chips 203 and the passive devices 204. To protect the chips 203 and the passive devices 204 better, the sealing material layer 205 may be filled into spaces between the chips 203, between the chips 203 and the passive devices 204, and/or between the passive devices 204.

The chip 203 may have a different thickness with the passive device 204, namely, the chip 203 may have a greater thickness, or the passive device 204 may have a greater one. Therefore, the sealing material layer 205 may have a thickness greater than anyone of the chip 203 and the passive device 204, which ensures better protection for the chip 203 and the passive device 204.

Thereafter, S404 may be performed. The adhesive layer 202 is removed. Since the adhesive layer 202 is organic and can be dissolved in certain organic solvent, the adhesive layer 202 may be removed by dissolving in an organic solvent.

Thereafter, S405 may be performed. The carrier board 201 is separated from the functional surfaces of the chip 203 and the passive device 204. Namely, after S404, the adhesive layer 202 is dissolved, or is molten and peelable. The carrier board 201 may be peeled from the functional surfaces of the chip 203 and the passive device 204 easily, exposing the functional surfaces of the chip 203 and the passive device 204.

Figure 21:
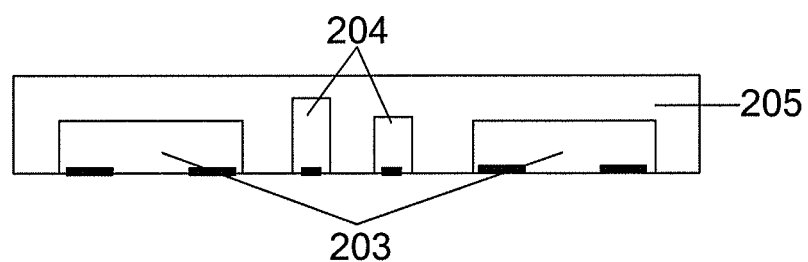
Figure 22:
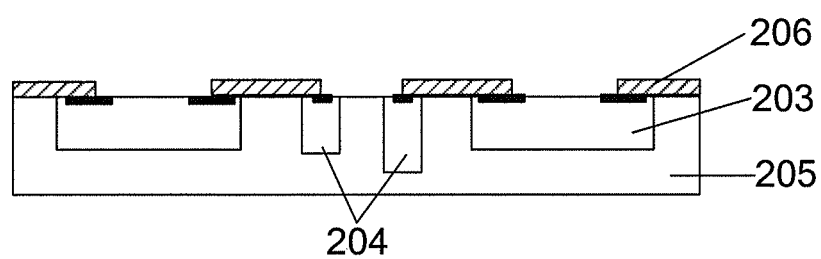
Figure 23:
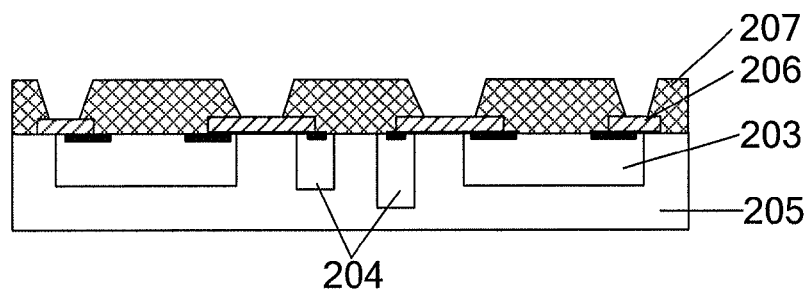
Figure 24:
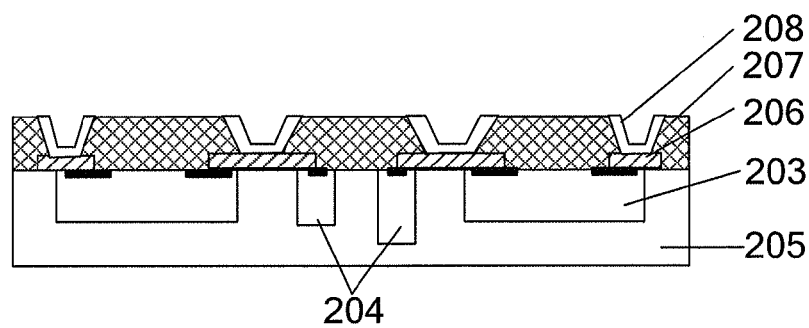
Figure 25:
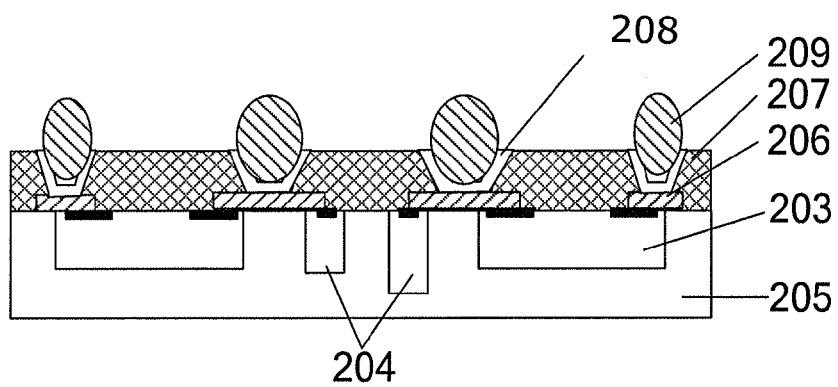

Thereafter, S406 may be performed. The functional surfaces of the chip 203 and the passive device 204 may be cleaned to remove the residual adhesive layer 202, so as to form a structure shown in FIG. 21. The chip 203 and the passive device 204 are no longer fixed together by the carrier board but by the packaging body, and the metal electrode of the chip 203 and the pad of the passive device 204 are exposed.

As shown in FIG. 22 to FIGS. 25, S407 to S410 are performed, including: forming a metal re-wiring layer 206 on the exposed functional surfaces of the chip 203 and the passive device 204, so that the metal electrode of the chip 203 may be functionally connected to the pad of the passive device 204 in system level; forming a protective film 207 on a surface of the metal re-wiring layer 206, and forming an opening by design requirements on the protective film 207 to expose the metal re-wiring layer 206; forming a sub-ball metal layer 208 in the opening; and forming a metal tin ball 209 on a surface of the sub-ball metal layer 208. S407 to S410 can be performed similarly to existing fan-out wafer packaging methods, which are not described in detail here.

After performing the above steps, the packaging may be basically completed.

Figure 26:
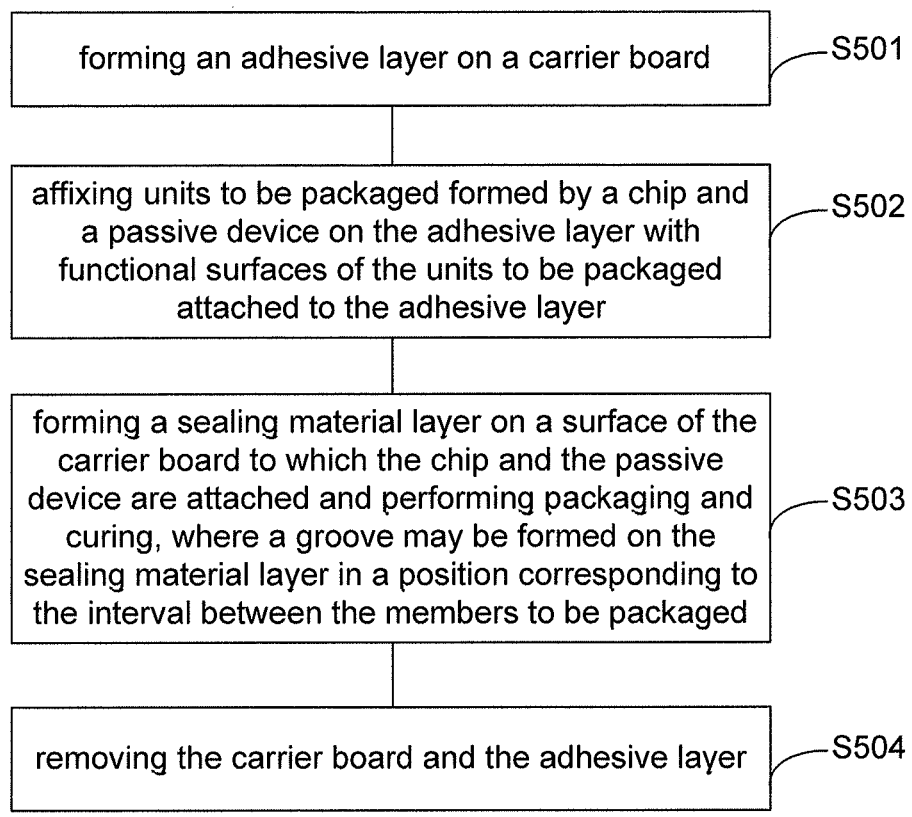
FIG. 26 schematically illustrates a flow chart of a packaging method according to a fifth embodiment of the present disclosure.

As shown in FIG. 26, in a fifth embodiment of the present disclosure, a packaging method may include following steps:

S501, forming an adhesive layer on a carrier board;

S502, affixing units to be packaged formed by a chip and a passive device on the adhesive layer with functional surfaces of the units to be packaged attached to the adhesive layer;

S503, forming a sealing material layer on a surface of the carrier board to which the chip and the passive device are attached and performing packaging and curing, where a groove may be formed on the sealing material layer in a position corresponding to the interval between the units to be packaged; and S504, removing the carrier board and the adhesive layer.

Figure 27:
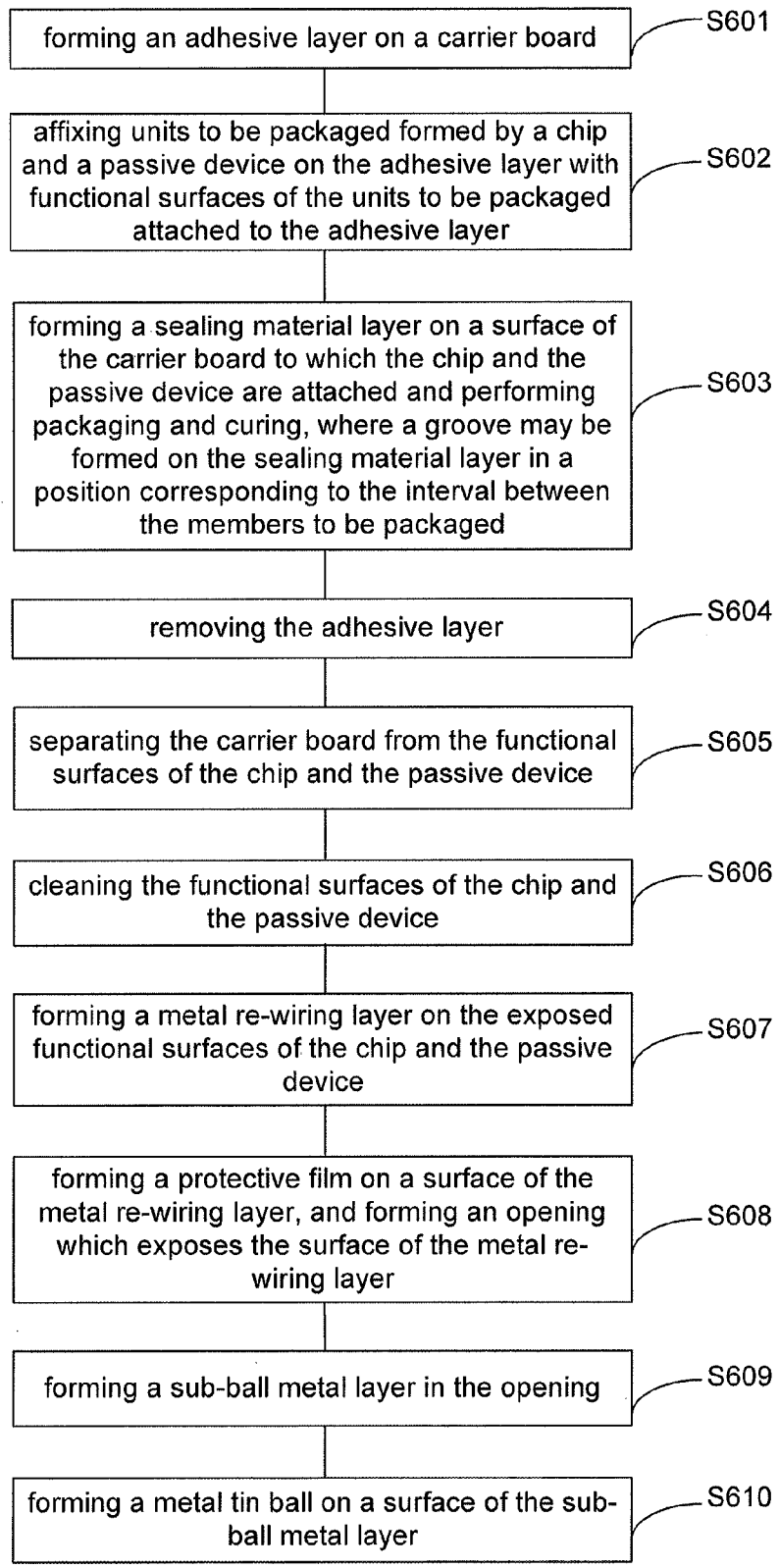
FIG. 27 schematically illustrates a flow chart of a packaging method according to a sixth embodiment of the present disclosure.

As shown in FIG. 27, in a sixth embodiment of the present disclosure, a packaging method may include following steps:

S601, forming an adhesive layer on a carrier board;

S602, affixing units to be packaged formed by a chip and a passive device on the adhesive layer with functional surfaces of the units to be packaged attached to the adhesive layer;

S603, forming a sealing material layer on a surface of the carrier board to which the chip and the passive device are attached and performing packaging and curing, where a groove may be formed on the sealing material layer in a position corresponding to the interval between the units to be packaged; and S604, removing the adhesive layer;

S605, separating the carrier board from the functional surfaces of the chip and the passive device;

S606, cleaning the functional surfaces of the chip and the passive device;

S607, forming a metal re-wiring layer on the exposed functional surfaces of the chip and the passive device;

S608, forming a protective film on a surface of the metal re-wiring layer, and forming an opening which exposes the surface of the metal re-wiring layer;

S609, forming a sub-ball metal layer in the opening; and

S610, forming a metal tin ball on a surface of the sub-ball metal layer.

Figure 28:
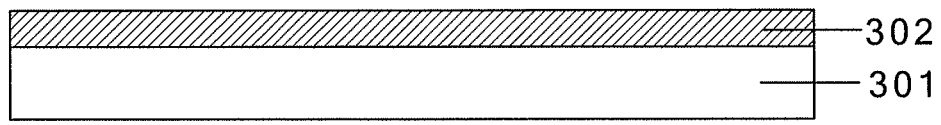
FIGS. 28 to 36 schematically illustrate intermediate cross-sectional views of a packaging structure formed with the method shown in FIG. 27.

In some embodiments, S601 may be performed first. An adhesive layer 302 may be formed on a carrier board 301, so as to form a structure shown in FIG. 28.

In S601, the carrier board 301 may be adapted to bear a chip 303 and a passive device 304.

In some embodiments, the carrier board 301 may be made of glass, which may have a good hardness and evenness, and reduce a failure rate of packaging. Besides, the carrier board 301 may be peeled in subsequent processes. Since the carrier board 301 made of glass is easily peeled and has a good resistance to corrosion, the carrier board 301 may not change in physical and chemical performance after contacting with the adhesive layer 302 and may be used repeatedly. It is well known in the art that a carrier board 301 made of other materials, such as silicon compound, may realize the objectives of the present disclosure as well.

The adhesive layer 302 formed on the carrier board 301 is adapted to fix units to be packaged formed by the chip 303 and the passive device 304 on the carrier board 301. The adhesive layer 302 may be made of different materials. In some embodiments, the adhesive layer 302 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 102 may be the second kind.

The method for forming the adhesive layer 302 on the carrier board 301 may be spin coating or printing, which are well known to those skilled in the art and not described in detail here.

Figure 29:
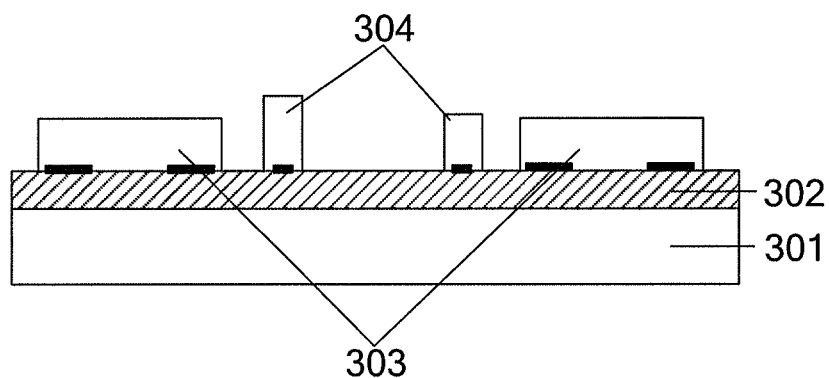

Thereafter, S602 may be performed. Functional surfaces of the units to be packaged formed by a chip 303 and a passive device 304 are affixed on the adhesive layer 302 to form a structure shown in FIG. 29.

In some embodiments, the functional surfaces of the units to be packaged formed by the chip 303 and passive device 304 may refer to a surface where a metal electrode of the chip 303 and a pad of the passive device 304 are disposed.

In some embodiments, the chip 303 attached to the adhesive layer 302 may include a plurality of different chips. The plurality of different chips may be a portion of a system-level packaging product and realize one or more independent functions of system-level functions respectively.

The passive device 304, realizing system-level functions of the units to be packaged along with the chip 303, is an external circuit, such as capacitors, resistors and inductors. The passive device 304 and the chip 303 with different functions are combined as a whole and then packaged, which may realize the required system-level functions.

In some embodiments, the combination of the chip 303 and the passive device 304 may be designed according to system functions of the units to be packaged. Therefore, around a chip 303, there may be one or more chips 303 having same or different functions, or there may be one or more passive devices 304 having same or different functions, such as capacitors, resistors or inductors. Similarly, around a passive device 304, there may be one or more passive devices 304 having same or different functions, or there may be one or more chips 303 having same or different functions.

Figure 30:
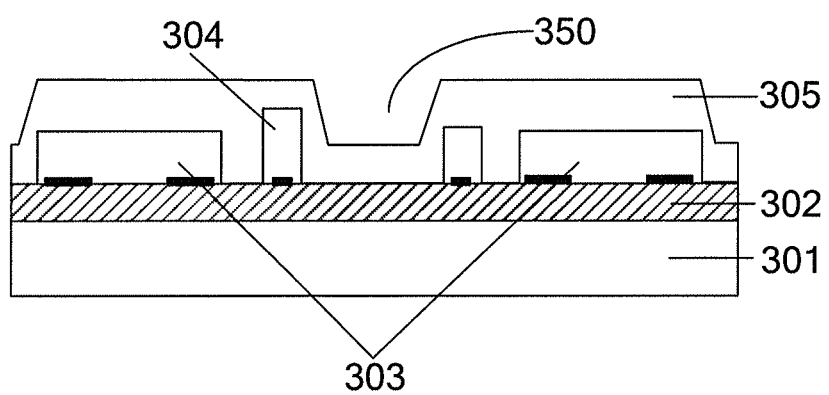

Thereafter, S603 may be performed. A surface of the carrier board attached to the chip and passive device is packaged and cured, so as to form a packaging body with a sealing material layer 305, i.e., to form a structure shown in FIG. 30. In subsequent process steps, the packaging body may protect all the surfaces except the functional surfaces of the chip 303 and the passive device 304 and act as a carrier in the subsequent processes.

In some embodiments, the sealing material layer 305 may be made of epoxy resin. Epoxy resin is a good material for forming the sealing material layer 305 as it has good sealability and is easily shaped. A method for forming the sealing material layer 305 may be transfer molding, compressing or printing, which are well known to those skilled in the art and not described in detail here.

As described above, around a chip 303, there may be other chips 303 or passive devices 304. And around a passive device 304, there may be one or more passive devices 304 having same or different functions, or there may be one or more chips 303 having same or different functions. Therefore, spaces may exist around the chips 303 and the passive devices 304. To protect the chips 303 and the passive devices 304 better, the sealing material layer 305 may be filled into spaces between the chips 303, between the chips 303 and the passive devices 304, and/or between the passive devices 304.

The chip 303 may have a different thickness with the passive device 304, namely, the chip 303 may have a greater thickness, or the passive device 304 may have a greater one. Therefore, the sealing material layer 305 may have a thickness greater than anyone of the chip 303 and the passive device 304, which ensures better protection for the chip 303 and the passive device 304.

Since the sealing material layer 305 and the carrier board 301 may have different thermal shrinkage ratios, inner stress of the sealing material layer 305 may be nonuniform, which may cause warp and distortion of the sealing material layer 305 in subsequent processes during wafer packaging and influence the quality of packaging products.

Figure 31:
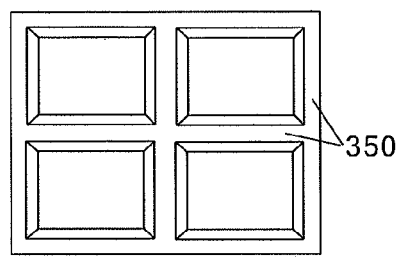

As shown in FIG. 31, in some embodiments, a groove 350 may be formed on the sealing material layer 305 in a position corresponding to the interval between the units to be packaged. The groove 350 may be formed after printing based on the design of stencil aperture and depth. With the groove 350, stress in the sealing material layer 305 may be balanced, thereby warp and distortion of the sealing material layer 305 in subsequent processes during wafer packaging may be avoided.

Cross sections of the groove 350 may be designed according to stress in the sealing material layer 305 and profiles of the devices to be packaged. In some embodiments, the cross sections of the groove 350 may be U-shaped, V-shaped or concave.

A depth of the groove 350 may be related to the design of the stencil. The groove 350 with a depth set according to the design of the stencil may effectively balance the inner stress of the sealing material layer 305.

In some embodiments, a plurality of grooves 350 may be formed on the sealing material layer, and each groove may be a closed loop around the units to be packaged. The closed loop may effectively reduce the stress around the chip 303 and the passive device 304 from the sealing material layer 305 and further balance the distribution of inner stress of the sealing material layer 305. Each groove 350 may be loop-shaped and define a square, a rectangle or a circle. Units to be packaged in a closed loop formed by each groove 350 may include a plurality of chips 303 or a combination of passive devices 304. The units to be packaged are arranged in matrix and the grooves 350 are disposed among the units to be packaged, namely, the units to be packaged are interlaced with the grooves 350.

The plurality of loop-shaped grooves 350 may be arranged in many ways so as to adapt to different arrangements of the chip 303 and the passive device 304. In some embodiments, the plurality of loop-shaped grooves 350 may be arranged in matrix.

Thereafter, S604 may be performed. The adhesive layer 302 is removed. Since the adhesive layer 302 is organic and can be dissolved in certain organic solvent, the adhesive layer 302 may be removed by dissolving in an organic solvent.

Thereafter, S605 may be performed. The carrier board 301 is separated from the functional surfaces of the chip 303 and the passive device 304. Namely, after S604, the adhesive layer 302 is dissolved, or is molten and peelable. The carrier board 301 may be peeled from the functional surfaces of the chip 303 and the passive device 304 easily, exposing the functional surfaces of the chip 303 and the passive device 304.

Figure 32:
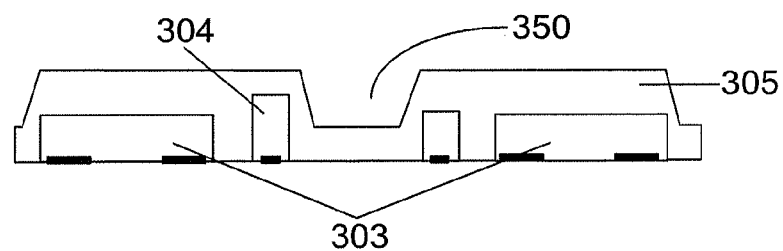
Figure 33:
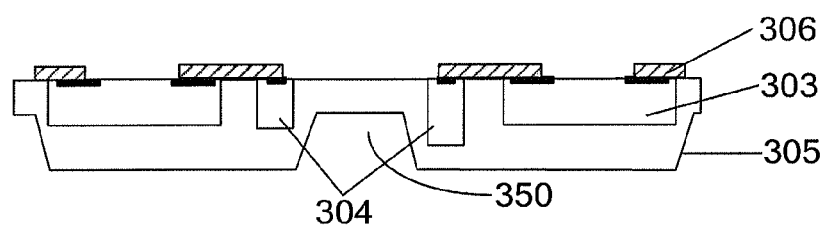
Figure 34:
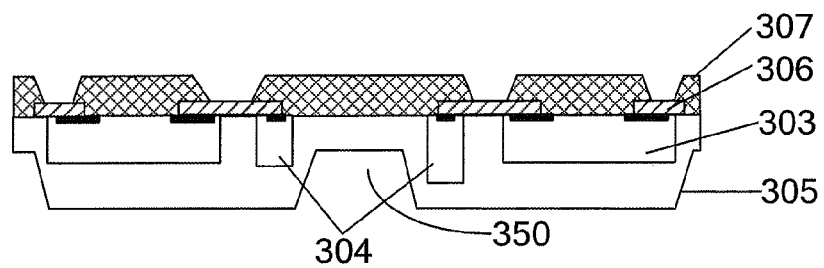
Figure 35:
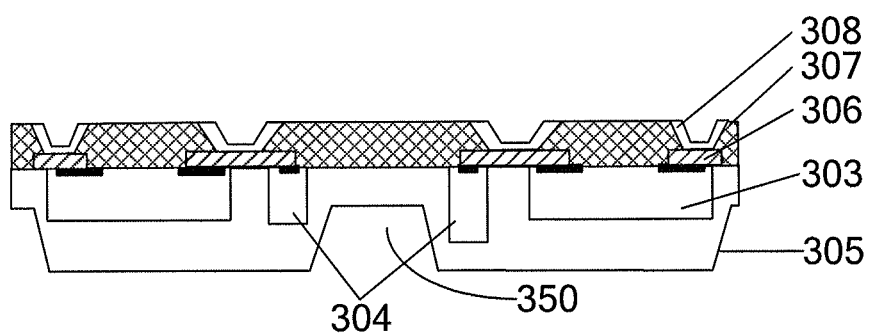
Figure 36:
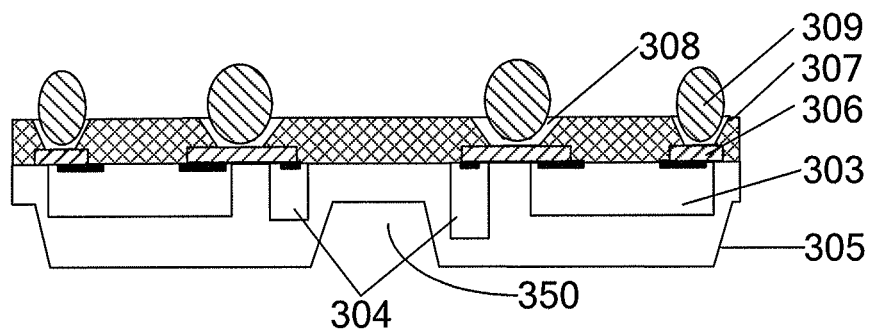

Thereafter, S606 may be performed. The functional surfaces of the chip 303 and the passive device 304 may be cleaned to remove the residual adhesive layer 302, so as to form a structure shown in FIG. 32. The chip 303 and the passive device 304 are no longer fixed together by the carrier board but by the packaging body, and the metal electrode of the chip 303 and the pad of the passive device 304 are exposed.

As shown in FIG. 33 to FIGS. 36, S607 to S610 may be performed, including: forming a metal re-wiring layer 306 on the exposed functional surfaces of the chip 303 and the passive device 304, so that the metal electrode of the chip 303 may be functionally connected to the pad of the passive device 304 in system level; forming a protective film 307 on a surface of the metal re-wiring layer 306, and forming an opening by design requirements on the protective film 307 to expose the metal re-wiring layer 306; forming a sub-ball metal layer 308 in the opening; and forming a metal tin ball 309 on a surface of the sub-ball metal layer 308. S607 to S610 can be performed similarly to existing fan-out wafer packaging methods, which are not described in detail here.

After performing the above steps, packaging may be basically completed.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A high-density system-level chip packaging method, comprising:
    forming an adhesive layer on a carrier board directly, where a shape and position of the adhesive layer correspond to shapes of functional surfaces of units to be packaged and positions on the carrier board where the units to be packaged are to be attached, respectively, so that the units to be packaged are attached according to the position of the adhesive layer in subsequent processes;
    affixing at least one chip and at least one periphery circuit on the adhesive layer with functional surfaces of the at least one chip and the at least one periphery circuit attached to the adhesive layer, where one unit to be packaged comprises one chip and one periphery circuit;
    forming a sealing material layer on a surface of the carrier board to which the at least one chip and the at least one periphery circuit are attached and performing packaging and curing, wherein a plurality of grooves are formed on the sealing material layer in positions corresponding to intervals between the units to be packaged, and the plurality of grooves form a plurality of closed loops each of which is around at least one of the units to be packaged; and
    removing the carrier board and the adhesive layer entirely.

2. The method according to claim 1, wherein when a plurality of chips are attached on the adhesive layer, the sealing material layer is filled into spaces between the plurality of chips; when the at least one chip and the at least one periphery circuit are attached on the adhesive layer, the sealing material layer is filled into spaces between the at least one chip and the at least one periphery circuit; and when a plurality of periphery circuits are attached on the adhesive layer, the sealing material layer is filled into spaces between the plurality of periphery circuits.

3. The method according to claim 1, wherein the at least one periphery circuit comprises a capacitor, a resistor or an inductor.

4. The method according to claim 1, wherein the sealing material layer is made of epoxy resin.

5. The method according to claim 1, wherein the sealing material layer is formed on the at least one chip and the at least one periphery circuit-by transfer molding, compressing or printing.

6. The method according to claim 1, wherein the adhesive layer is made of ultraviolet adhesive.

7. The method according to claim 1, wherein an alignment part is disposed on the carrier board.

8. The method according to claim 7, wherein a shape and size of the alignment part are determined by a plurality of location parts.

9. The method according to claim 8, wherein the plurality of location parts are cruciform, dual cruciform, star-shaped, L-shaped, dual-L-shaped or point-shaped.

10. The method according to claim 1, wherein the adhesive layer comprises a plurality of adhesive blocks separated from one another.

11. The method according to claim 10, wherein at least two of the plurality of adhesive blocks have different shapes.

12. The method according to claim 10, wherein the plurality of adhesive blocks are square, rectangular or circular.

13. The method according to claim 10, wherein the plurality of adhesive blocks are arranged on the carrier block in matrix.

14. The method according to claim 13, wherein the plurality of adhesive blocks are spaced at a same interval on the carrier board.

15. The method according to claim 10, wherein an interval between the plurality of adhesive blocks is determined according to the arrangement scheme of the units to be packaged.

16. The method according to claim 1, wherein removing the carrier board and the adhesive layer comprises:
    removing the adhesive layer;
    separating the carrier board from the functional surfaces of the at least one chip and the at least one periphery circuit; and
    cleaning the functional surfaces of the at least one chip and the at least one periphery circuit.

17. The method according to claim 1, wherein the at least one chip comprises a plurality of different chips.

18. The method according to claim 1, wherein the carrier board is made of glass.

19. The method according to claim 1, further comprising:
forming a metal re-wiring layer on the exposed functional surfaces of the at least one chip and the at least one periphery circuit;
forming a protective film on a surface of the metal re-wiring layer;
forming an opening which exposes the surface of the metal re-wiring layer in the protective film layer;
forming a sub-ball metal layer which is connected with the metal re-wiring layer in the opening; and
forming a metal welding ball on a surface of the sub-ball metal layer.

* * * * *